United States Patent [19]

Kaneko et al.

[11] Patent Number: 5,268,063

[45] Date of Patent: * Dec. 7, 1993

[54] METHOD OF MANUFACTURING SINGLE-CRYSTAL SILICON

[75] Inventors: Kyojiro Kaneko, Osaka; Hideyuki Mizumoto, Oaza-kamimabushi, both of Japan

[73] Assignee: Sumitomo Sitix Co., Ltd., Hyogo, Japan

[ * ] Notice: The portion of the term of this patent subsequent to Jun. 29, 2010 has been disclaimed.

[21] Appl. No.: 876,104

[22] Filed: Apr. 30, 1992

Related U.S. Application Data

[63] Continuation-in-part of Ser. No. 684,174, Apr. 12, 1991, Pat. No. 5,233,077.

[30] Foreign Application Priority Data

Apr. 27, 1990 [JP] Japan .................................. 2-112050
Apr. 30, 1991 [JP] Japan .................................. 3-128624

[51] Int. Cl.[5] ........................................... C30B 29/06
[52] U.S. Cl. ........................... 156/617.1; 156/618.1; 156/620.4; 156/DIG. 83; 156/DIG. 102; 156/DIG. 103
[58] Field of Search ............... 156/617.1, 618.1, 620.4, 156/DIG. 64, DIG. 83, DIG. 102, DIG. 103

[56] References Cited

U.S. PATENT DOCUMENTS

| | | | |
|---|---|---|---|
| 4,090,851 | 5/1978 | Berkman et al. | 156/DIG. 83 |
| 4,224,100 | 9/1984 | Hartzell | 156/616.1 |
| 4,361,114 | 11/1982 | Gurev | 118/723 |
| 4,515,755 | 5/1985 | Matsuo et al. | 156/620.4 |
| 4,874,458 | 10/1989 | Nishizawa | 156/618.1 |
| 4,915,723 | 4/1990 | Kaneko et al. | 65/144 |
| 5,211,802 | 5/1993 | Kaneko et al. | 156/616.2 |

Primary Examiner—Olik Chaudhuri
Assistant Examiner—Felisa Garrett
Attorney, Agent, or Firm—Oblon, Spivak, McClelland, Maier & Neustadt

[57] ABSTRACT

A single crystal silicon is prepared by constructing a silicon melt reservoir of an induction coil coated on its internal surface with a layer of a high melting point insulating material and placing silicon raw material in the reservoir, heating the silicon raw material by application of an external heating means and by current applied to the induction coil which electromagnetically heats the silicon thereby forming a pool of molten silicon in the reservoir, actively cooling said induction coil, and drawing up a single crystal silicon rod from the molten silicon in the melt reservoir.

7 Claims, 5 Drawing Sheets

METHOD OF MANUFACTURING SINGLE-CRYSTAL SILICON

CROSS REFERENCE TO RELATED APPLICATIONS

This application is a continuation-in-part of application Serial No. 07/684,174 filed Apr. 12, 1991, now U.S. Pat. No. 5,233,077.

BACKGROUND OF THE INVENTION

1. Field of the Invention

The present invention relates to a method of manufacturing single-crystal silicon by the Czochralski pulling method (hereinafter called the CZ method).

2. Description of the Background

Single-crystal silicon is an essential element in the manufacture of various semiconductors and highly effective solar batteries and can be obtained industrially by the CZ method, wherein the single-crystal silicon is pulled up from a silicon melt. Another known method of manufacture is the floating zone method (the FZ method), in which a polycrystalline silicon rod is inserted into an induction coil to create single-crystal silicon. The CZ method is regarded as economical, because it requires less processing and because it provides a more profitable yield than the FZ method. However, the CZ method does not achieve single-crystal silicon of a quality equivalent to that obtained by the FZ method, mainly because of the fact that the resultant single-crystal silicon is contaminated by impurities from the worn quartz crucible containing the silicon melt.

Also, the continuous pulling of a single-crystal silicon rod for hours is an inherent feature of the CZ method, which is difficult to do for long periods of time. In principle it is possible to make the specific resistance of the single crystalline silicon rod constant by continuously drawing up the Si melt for a long time which results in substantially improved yield and greater efficiency of furnace operation. However, no fully satisfactory continuous pulling operation is known in achieving these objectives primarily because of wear of the quartz crucible similar to deterioration of the quality of single-crystal silicon.

The introduction of an electromagnetic melting step into the CZ method has been recently watched with keen interest in light of the above objectives. The electromagnetic melting process is a kind of floating melting method, which uses a circumferentially divided water-cooled conductive crucible for melting the material placed therein as it floats through an electromagnetic field. The principle has been adopted in a polycrystalline silicon manufacturing apparatus as disclosed in Japanese Unexamined Patent Application Nos. 61-52962, 1-264920 and 2-30698 and the like. The electromagnetic melting process may be employed in the CZ method thereby allowing a silicon melt placed in a crucible to be kept away from the inner surfaces of the crucible, in order to substantially reduce wear and consumption of the crucible in principle, thereby preventing the single-crystal silicon from being polluted by impurities from the crucible which ensures that the resultant single-crystal silicon has a quality equivalent to that obtained by the FZ method and which enables continuous pulling of single-crystal silicon for extended periods of time.

The above technique, however, has many problems and has not yet been practically used on an industrial basis. One of the factors hindering industrialization of the CZ method using the electromagnetic melting process is an agitation or stirring phenomenon of the silicon melt which is in the crucible, as the melt is kept away from the inner surface of the crucible. This stirring phenomenon is shown in FIG. 6.

FIG. 6 shows an electrically conductive crucible 2 divided in a circumferential direction and arranged inside an induction coil 1. The respective divided pieces of crucible 2 are electrified by an alternating current flowing through induction coil 1 and thus a magnetic field is applied to silicon melt 3 within crucible 2 in the longitudinal axial direction. As a result, silicon melt 3 is electrified in a circumferential direction which generates Joule's heat. However, this magnetic field is inevitably weakened in the upward and downward directions because of the construction of the induction coil 1 and a stirring force is added to silicon melt 3 by a difference of Lorentz force on the basis of such an uneven distribution of the magnetic field. Further, the flow of liquid by this stirring force is remarkably intensified by the accumulative effect of the following three phenomena.

The first effect is the strong stirring force imparted to silicon melt 3 which is proportional to the power applied to the induction coil 1.

The second effect is the stirring force which is increased in the low-frequency band. That is to say, in the electro-magnetic melting of silicon, if the induction frequency is high, the current efficiency is improved but the skin effect is quite noticeable, so that eddy currents do not arrive at the central portion of the silicon melt 3 within the crucible 2 and thus the central portion of silicon melt 3 is not sufficiently melted. Accordingly, during the production of a large-sized single crystalline rod 4 the induction frequency is inevitably reduced. For example, a low-frequency band of 2 to 3 kHz is selected. However, at such a low-frequency band, the electric current penetrates to a depth of silicon melt 3 within the crucible 2 and thereby generates a strong stirring force within silicon melt 3. This is a substantial disadvantage in the production of large-sized single crystalline rods 4 these days.

The third effect is that the silicon melt floats within crucible 2 and is apt to move itself.

The flow of liquid by the stirring force is intensified incomparably and augmented by thermal convection in the melt which is shown by the broken line in FIG. 6. Thermal convection is generated by conventional melting in the crucible. As a result, the liquid surface of the silicon melt 3 violently surges and thus swirl defects, transfers and the like resulting from temperature fluctuations are produced in the single crystalline rod 4 drawn up from the silicon melt 3. All of this results in deterioration in quality of the single crystalline rod 4.

Another factor which hinders industrialization of the CZ method using the electro-magnetic process is the increased cost of electric power. That is to say, in the CZ method which uses the conventional electro-magnetic melting process, almost half of the electric power applied is consumed in the heating of the crucible. Accordingly, in spite of direct heating of the silicon by eddy currents, the economy of the process is not improved. A need therefore continues to exist for improvements in the CZ method of forming single crystal silicon.

SUMMARY OF THE INVENTION

Accordingly, one object of the present invention is to provide a method of manufacturing single-crystal silicon with a particularly higher electric power consumption efficiency in comparison to the conventional CZ method which uses electromagnetic melting dissolution and which suppresses the stirring of the silicon melt.

Briefly, this object and other objects of the present invention as hereinafter will become more readily apparent can be attained in a method for preparing single-crystal silicon by constructing a silicon melt reservoir of an induction coil coated on its internal surface with a layer of a high melting point insulating material and placing silicon raw material in the reservoir, heating the silicon raw material by application of an external heating means and by current applied to the induction coil which electromagnetically heats the silicon thereby forming a pool of molten silicon in the reservoir, actively cooling the induction coil and drawing up a single crystal silicon rod from the molten silicon in the melt reservoir.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE PREFERRED EMBODIMENTS

The method of manufacturing single-crystal silicon of the present invention employs a melt reservoir which serves also as an induction coil. The electromagnetic field developed by the induction coil affects silicon in the melt reservoir directly but not through the crucible, and improves the efficiency of electric power consumption by a factor which is almost twice that of the conventional CZ method using the electromagnetic melt process.

When silicon which is placed in the melt which also serves as the induction coil, is melted, the silicon melt is brought into contact with the inner surface of the melt reservoir. Silicon, as it is heated, decreases in specific resistance and makes a good conductor in its liquid form so that when the silicon melt directly contacts the induction coil, the induction coil is short-circuited. In the manufacturing technique of the present invention for preparing single-crystal silicon, the induction coil is coated on its inner surface with an insulating material, which prevents short-circuiting of the induction coil, and the silicon melt is cooled by the reservoir and solidifies, thereby forming a skull layer of silicon over the inner surface of the melt reservoir.

The skull layer of silicon protects the melt reservoir and prevents the silicon melt inside the skull layer of silicon from being contaminated by the insulating material which covers the inner surface of the induction coil. In addition, the silicon melt inside the skull layer of silicon adheres thereto, so that the silicon melt in the crucible, even when subjected to an intensive stirring force, does not exhibit the agitation phenomenon normally exhibited by a silicon melt when kept in a floating state. Hence, the present method ensures a high quality single-crystal silicon rod as it is pulled from the silicon melt.

Figure 1:
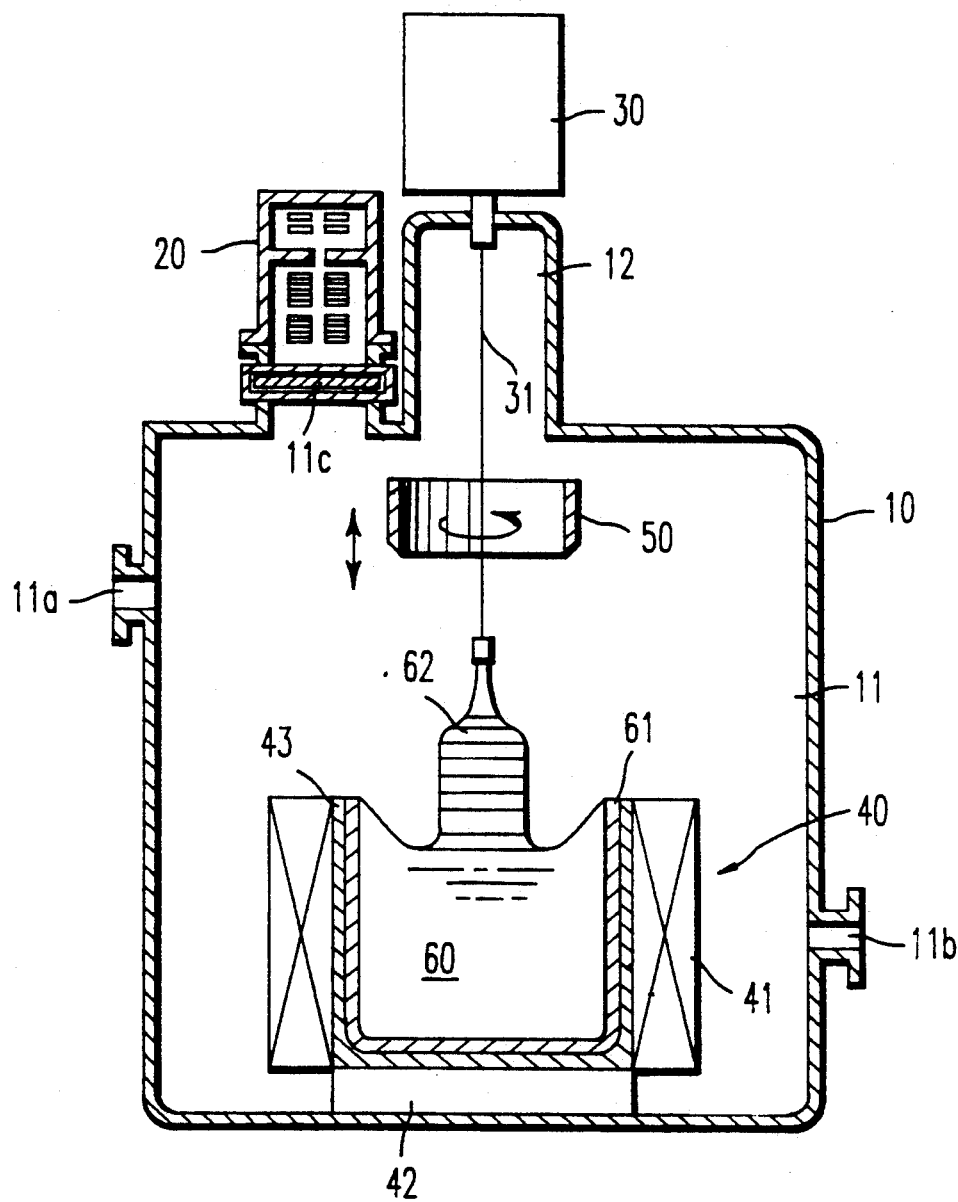
FIG. 1 is a schematic sectional view of an apparatus useful for practicing the method of the present invention in which a silicon skull layer is formed.

FIG. 1, as an embodiment of the invention, is a schematic sectional view of an apparatus suitable for use in the technique of the present invention.

The apparatus shown in FIG. 1 comprises an airtight casing 10 containing therein a melt reservoir 40 and a magnetic shield 50. The airtight casing 10 has a cylindrical melt chamber 11 and a pulling chamber 12 projecting upwardly and coaxially thereof. The melt chamber 11 is provided with an inactive gas introduction port 11a and an inactive gas exhaust port 11b, and at the upper part with an electron beam gun 20 having a vacuum valve 11c. A pull means 30 having a wire 31 is disposed above the pulling chamber 12.

Figure 2:
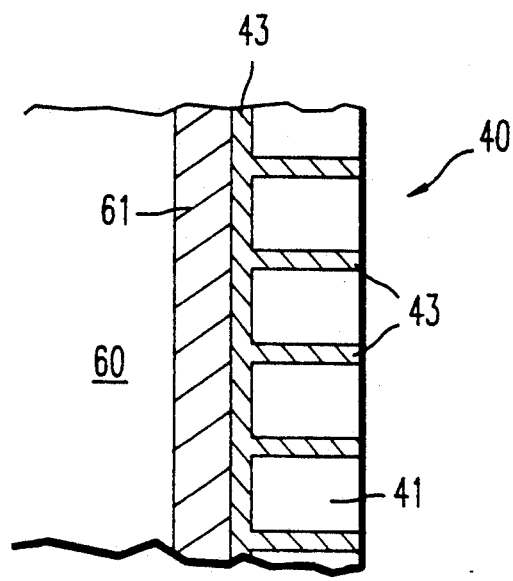
FIG. 2 is an enlarged sectional view of a part of the melt reservoir of FIG. 1.

The melt reservoir 40 is disposed axially centrally in the melt chamber 11 of the airtight casing 10 and is provided with an annular induction coil 41 and a disc-like shaped fireproofing bottom plate 42 for closing the bottom of the coil 41. An insulating layer 43 covers the inner peripheral surface of the induction coil 41 and the upper surface of the fireproofing bottom plate 42. The insulating layer 43 is made of a silicon compound of a higher melting point than silicon such as $Si_3N_4$, $SiO_2$ or the like and is also interposed between coils of the induction coil 41 (see FIG. 2). The thickness of the insulating layer 43 on the inner surface of the melt reservoir is preferably 0.15 mm or more and is not required to be more than 0.25 mm.

The electron beam gun 20 is adapted to direct an electron beam into the melt reservoir 40. Other heating methods besides electron beam heating include graphite induced heating which is a contact method of heating.

The magnetic shield 50 is an annular member made of a water-cooled conductive material such as aluminum, copper or the like, or molybdenum, graphite or the like, each of which is not water-cooled and has an outer diameter slightly smaller than the inner diameter of the reservoir 40, so that the magnetic shield 50 is moved up and down in the melt chamber 11 and inserted into the melt reservoir 40 through its upper opening when required.

In the actual method of the invention, blocks or granules of silicon formed of polycrystalline silicon are placed in the melt reservoir 40 with the magnetic shield 50 being withdrawn over the reservoir. Then, the airtight casing 10 is evacuated through the exhaust port 11b to a degree of vacuum required for application of the electron beam, and the electron beam gun 20 is activated which directs an electron beam at the silicon material placed in the melt reservoir 40 which causes the silicon material to partially melt, while the induction coil 41 of the reservoir 40 is excited. The induction coil 41 is properly water-cooled.

Excitation of the induction coil 41 causes an electromagnetic field to directly affect the silicon material in the reservoir 40. The silicon material, when in a solid state, does not have eddy current enough to allow the silicon material to melt. An electron beam is directed at the silicon material to form a pool therein through which a sufficient eddy current flows, and the pool starts to enlarge as it emits heat (Joule's heat). When a predetermined amount of molten silicon forms, the application of the electron beam is stopped.

When the silicon material in the melt reservoir 40 melts, a silicon melt 60 is brought into contact with the inner surface of the reservoir 40. The inner surface of the induction coil 41 is covered with the insulating layer 43 to keep the silicon melt 60 from directly contacting the induction coil 41. Hence, the induction coil 41 is not short-circuited by the silicon melt 60, and the silicon melt 60 is cooled and the portion thereof in contact with the inner surface of the melt reservoir solidifies thereby forming a silicon skull layer 61 which acts as an insulation layer and does not melt without the presence of Joule's heat. When required, a silicon material is supplied into the melt reservoir 40 through a hopper (not shown) provided in the airtight casing 10.

When the melt reservoir 40 contains the silicon melt 60, the pull means 30 is activated to pull upward wire 31 to which the silicon melt 60 adheres and the wire is turned. The molten silica solidifies in a cylindrical shape on the liquid surface thereby forming a single-crystal silicon rod 62. At any proper stage after completion of application of the electron beam, an inactive gas such as argon or the like is introduced through the gas introduction port 11a into the airtight casing 10 to elevate the pressure inside to atmospheric pressure.

The manufacturing method according to the present invention has the following advantages in comparison with the conventional CZ method using the electro-magnetic melt process.

The melt reservoir 40 includes the induction coil 41 as an essential component, so that an electromagnetic field generated by the induction coil 41 directly effects the silicon placed in the reservoir 40. Hence, the present method improves power consumption efficiency by two times that of the conventional method which interposes a water-cooled crucible between silicon and the induction coil.

The melt reservoir 40 is protected by the skull layer 61 of silicon, so that the reservoir 40 is not worn in a manner substantially similarly to the wear which occurs in the conventional method which keeps a silicon melt in a floating state in the water-cooled crucible.

The insulating layer 43, which serves as an inner layer of the melt reservoir 40, is formed of a silicon compound higher-melting than silicon, so that the insulating layer 43 itself is less likely to contaminate silicon. Also, the solidified skull layer 61 of silicon of the silicon melt 60, which layer intervenes between the insulating layer 43 and the silicon melt 60, prevents the single-crystal silicon from being contaminated by an impurity from the melt reservoir 40 to a level of contamination equivalent to the conventional method wherein the silicon melt is kept floating in the water-cooled crucible.

The bottom and outer peripheral surfaces of the silicon melt 60, in the melt reservoir 40 adhere to the silicon skull layer 61 so that the silicon melt 60 is not agitated as conventionally by an intensive stirring force which is generated at low frequency operation, thereby restraining the liquid surface of the silicon melt 60 from developing waves, thereby largely eliminating the swirl defect, dislocations and the like of a single-crystal rod 62 obtained from the silicon melt 60 in comparison to the conventional method.

When the silicon melt 60 is stirred which causes waves to form on the liquid surface, the magnetic shield 50 is moved down into the melt reservoir 40 thereby approaching the liquid surface of the silicon melt 60 and continues to gradually move downward as the surface of the liquid drops as the single-crystal silicon rod 62 is pulled up from the melt, so that the liquid surface of the silicon melt 60 can be almost perfectly prevented from forming waves during the pulling operation of the single-crystal silicon rod 62 to further improve the quality thereof.

Accordingly, the techniques of the present invention for manufacturing single-crystal silicon provide single-crystal silicon of improved quality in comparison to the conventional CZ method which uses an electromagnetic melt process.

Polycrystalline silicon granules manufactured by fluidized-bed granulation may be preferably used as the silicon material for ease of loading into the reservoir, but replenishment of the Si in the reservoir by molten silicon is also possible.

In the aspect of the invention described above which features the formation and case of a skull layer, a magnetic field formed by the induction coil acts upon silicon within the melt vessel directly without a crucible being present, so that the electric power consumption efficiency increases to about twice that of the conventional CZ indirect electro-magnetic melting process which uses a crucible. Since the silicon melt within the melt vessel adheres to the silicon skull layer, violent stirring of the melt, as in the case where the silicon melt is held by floatation, does not occur even in the case where a strong stirring force acts upon the silicon melt. The silicon skull layer acts as an insulator, so that the silicon melt can be prevented from being contaminated with impurities from the high-melting-point insulator and thus a level of purity of the silicon melt equal to that in the case where the silicon melt is held by flotation can be secured.

However, it has now been discovered in the instance where the CZ method is conducted using the skull-melting process where it is necessary to form the silicon skull layer along the inner surface of the melt vessel so that solid silicon and molten silicon coexist within the melt vessel, that the temperature of said molten silicon cannot be sufficiently increased. If the temperature of the silicon melt is low, the seed material which is used to draw up the single crystal is not intimately in contact with the silicon melt and thus it becomes difficult to seed. In addition, even if it is possible to seed, the diameter of the single crystalline rod drawn up is increased, which means that the diameter of the single crystalline rod drawn up cannot be controlled and thus there is the possibility that the diameter of the single crystalline rod drawn up gradually increases thereby producing a conical rod.

In order to solve these problems, the electric power applied to the induction coil has been increased to an extent that the silicon skull layer disappears. It was then observed that the silicon melt within the melt vessel was heated to a temperature suitable for drawing up the single crystal. At the same time, it was made clear that the insulator was lost along with the disappearance of the silicon skull layer, so that the silicon melt within the melt vessel was brought into direct contract with the high-melting-point insulator coated in the inner surface of the induction coil. Here the high-melting-point insulator was held at low temperatures to prevent the insulator from acting upon the silicon melt by actively cooling the induction coil. The silicon melt could be effectively prevented from being contaminated under this condition. Thus, the present method of producing a silicon single crystal employs a device in which a high-melting-point insulating layer is coated on an inner surface of an induction coil which applies an alternating magnetic field to the silicon in order to melt the silicon inside the melt vessel. The silicon is melted within the melt vessel and the induction coil is actively cooled. The silicon melt within the melt vessel is heated and the melt which is formed is brought into direct contact with the high-melting-point insulating layer. A single crystalline rod is then drawn up from the silicon melt.

It is desirable that an applied Lorentz force suppress the flow of the silicon melt with the flow of the silicon melt upon the silicon melt being applied to the silicon melt within the melt vessel separately form the alternating magnetic field for heating of the silicon.

In the method of producing a silicon single crystal by this aspect of the present invention, the induction coil is used also as the melt vessel and the magnetic field acts directly upon silicon within the melt vessel. The silicon melt within the melt vessel adheres to the inner surface of the vessel and suppresses stirring of the silicon melt. No silicon skull layer exists between the silicon melt and the inner surface of the vessel and thus the temperature of the melt is increased. In spite of the direct contact of the silicon melt with the high-melting-point insulator, the silicon melt can be prevented from being contaminated with impurities from the high-melting-point insulator by the active cooling of the induction coil.

Figure 4:
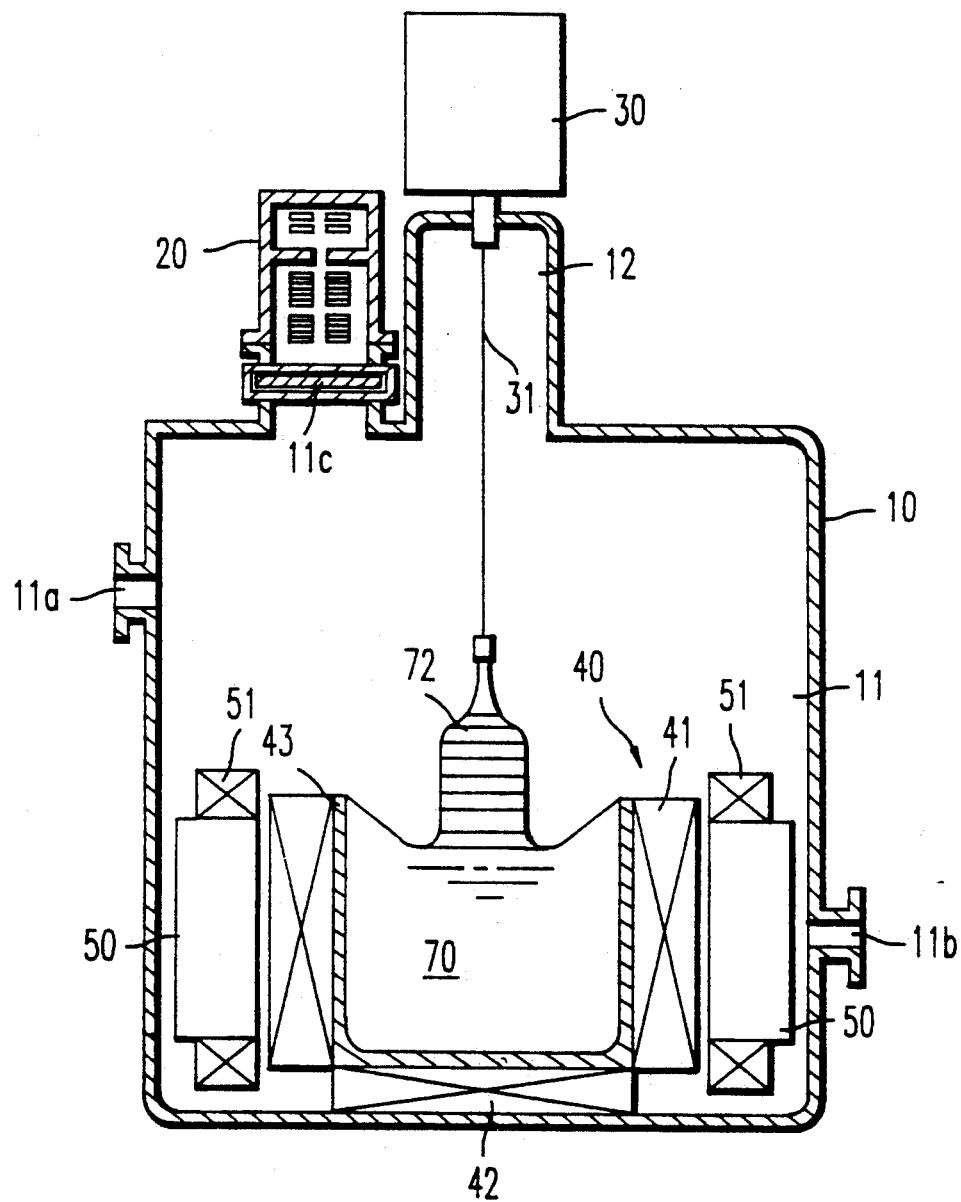
FIG. 4 is a schematic sectional view of an apparatus useful in practicing the method of the invention in which a silicon skull layer is not formed.
Figure 5:
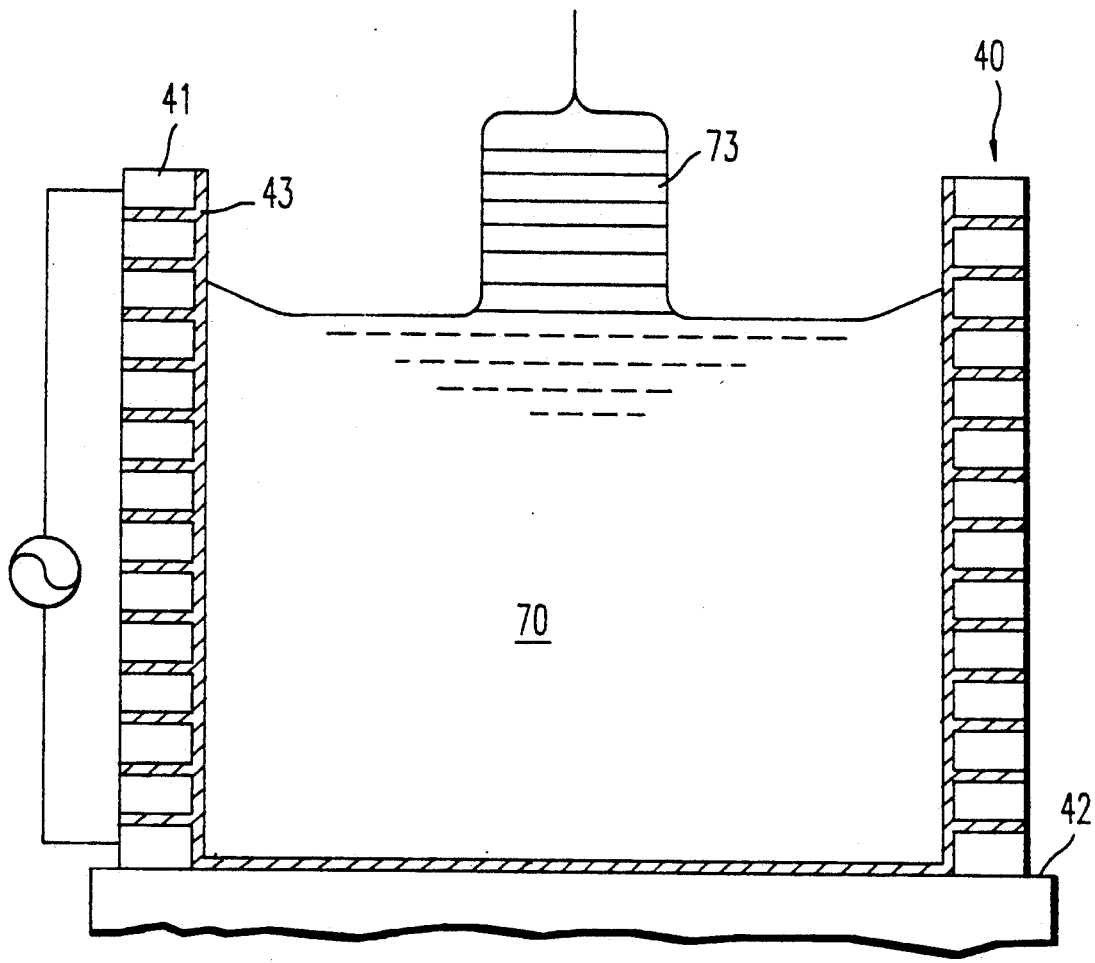
FIG. 5 is an enlarged sectional view of a part of the melt reservoir of FIG. 4.
Figure 6:
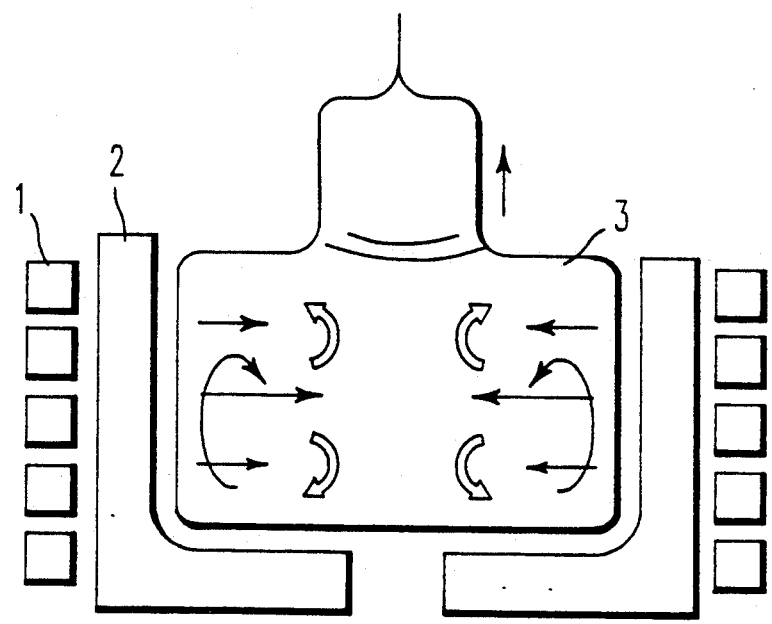
FIG. 6 is a schematic drawing which shows the stirring of molten silicon which can occur in a reservoir containing molten Si.

FIG. 4 is a rough sectional view of an apparatus suitable for placing the method of the present invention into practice. The apparatus shown in FIG. 4 is provided with an airtight vessel 10 housing a melt vessel 40 and magnetic poles 50, 50 therein. The airtight vessel 10 is composed of a cylindrical melt chamber 11 and a drawing-up chamber 12 concentrically positioned on the cylindrical melt chamber 11. The melt chamber 11 is provided with an inert gas-introducing port 11a and an exhaust port 11b, and an electron beam gun 20 is arranged above the melt chamber 11 through a vacuum valve 11c. In addition, drawing-up means 30 having a wire 31 is arranged above drawing-up chamber 12.

Melt vessel 40 is arranged in a central portion within the melt chamber 11 of the airtight vessel 10. Melt vessel 40 has a circular induction coil 41 and a block 42 which closes the bottom of circular induction coil 41. These induction coils are actively cooled by passing cooling water through the inside thereof. The inner circumferential surface of the induction coil 41 and the upper surface of block 42 are coated with an insulating layer 43 made of high-melting-point insulating material such as $SiO_2$ and $Si_3N_4$. The high-melting-point insulating materials forming insulating layer 43 desirably include silicon compounds having a high electrical insulation, a high thermal conductivity, a high melting point and stable physical properties. Preferred is $SiO_2$.

Insulating layer 43 made of $SiO_2$ is formed, for example, as follows. A silicone oil is applied to the surface of an induction coil. Methyl groups are decomposed at 300° to 400° C. to form an insulating thin layer (0.3 mm or less) made of inorganic $SiO_2$. A mixture of $SiO_2$ powders and the silicone oil is applied to the thin layer in a thickness of 1 mm or less. The insulating layer 43 formed in the above described manner is highly electrically insulative, thin and superior in thermal conductivity. Accordingly, if the insulating layer 43 is actively cooled from the back side thereof, it is held at low temperatures even though its surface is brought into contact with the silicon melt and no reaction occurs between it and the silicon melt and no reaction occurs between it and the silicon melt, so that no contaminant is extracted. A similar insulating layer 43 is disposed also among layers of the induction coil 41. It is desirable that the thickness of the insulating layer 43 be reduced so far as the insulation and the like are secured, preferably 1.0 mm or less.

Magnetic poles 50, 50 are arranged on both sides of the melt vessel 40 so as to stand face to face and a horizontal direct current magnetic field is passed through the inside of the melt vessel 40 by means of coils 51, 51. The magnetic poles 50, 50 are connected with each other between back surfaces thereof through a yoke (not shown).

The method of manufacture using the above described device is as follows. First, a massive or granular and particulate silicon as a raw material made of polycrystalline silicon is charged into the melt vessel 40. Then, airtight vessel 10 is evacuated through exhaust port 11b until the vacuum within the airtight vessel 10 reaches the level necessary for application of election beams. As soon as the airtight vessel 10 is evacuated, electron beam gun 20 is operated to project electron beams against the silicon raw material charged into the melt vessel 40, thereby locally melting silicon raw material, and at the same time the induction coil 41 of the melt vessel 40 is electrified. The induction coil 41 and the block 42 at the same time, are cooled.

A magnetic field acts directly upon silicon as a raw material within the melt vessel 40 by electrifying induction coil 41. However, an eddy current sufficient for melting silicon as raw material is not generated under the condition that silicon, as a raw material, is solid. But, when silicon as raw material is heated by an applied electron beam to form a pool, a sufficient eddy current flows through the pool to begin to enlarge the pool by a self-heating because of Joule's heat. When an appointed pool of silicon as raw material is formed, the application of electron beams is stopped.

When silicon as raw material charged into the melt vessel 40 is melted, a silicon melt 70 is brought into contact with the inner surface of the melt vessel 40, but the inner surface of the melt vessel 40 is coated with the insulating layer 43, so that a short circuit is not formed between the induction coil 41 and silicon melt 70.

When melt vessel 40 is filled with silicon melt 70, drawing-up means 30 is operated under the condition that the direct magnetic field is applied to the silicon melt 70 by means of the magnetic poles 50, 50 to draw up the silicon melt 70 from the liquid surface by means of wire 31, with solidification of the melt in a conical shape as the solidifying material is revolved thereby forming a single crystalline rod 72. At a suitable step after the application of electron beams has been finished, an inert gas such as argon is introduced into the airtight vessel 10 through inert gas-introducing port 11a to switch over to an atmospheric pressure operation. Silicon as raw material is suitably replenished in the melt vessel 40 from a hopper (not shown) within the airtight vessel 10.

It is desirable with respect to ease of addition of raw material and the like to use granular polycrystalline silicon produced by, for example, the fluidized particle-producing method, as silicon raw material.

The method according to the present invention has the following advantages in comparison to the indirect CZ electro-magnetic melting process using the conventional crucible.

The induction coil 41 is a constituent element of the melt vessel 40, so that the magnetic field generated by the induction coil 41 acts directly upon silicon within the melt vessel 40. Accordingly, the consumption efficiency of electric power is almost doubled compared with the conventional method in which a water-cooled crucible is disposed between silicon and the induction coil.

No skull layer exists, but merely the silicon melt 70 exists within the melt vessel 40. Accordingly, the temperature of the silicon melt 70 increases which makes seeding during the drawing-up process easy. In addition, the temperature of the silicon melt 70 can be rapidly increased and reduced during temperature-control, so that expansion or a contraction of the single crystalline rod 72 during the drawing-up process can be suppressed. As a result, the single crystalline rod 72 is controlled in diameter within a controlled drawing-up rate and thus the single crystalline rod 72 has a uniform diameter all over its length.

The bottom surface and the outer circumferential surface of the silicon melt 70 within the melt vessel 40 adhere to insulating layer 43, which makes the silicon melt 70 difficult to stir. In the case where the stirring occurs, a Lorentz force acts upon the silicon melt 70 in a direction which prevents stirring by the direct current magnetic field formed between magnetic poles 50, 50. Thus, also in case of large-power low-frequency operation, where a strong stirring force acts upon the silicon melt 70, no violent stirring occurs in the silicon melt 70 different from the conventional method. As a result, surging of the liquid surface of the silicon melt 70 can be suppressed and thus swirl defects, transfers and the like in the single crystalline rod 72 drawn up from the silicon melt 70 can be substantially reduced in comparison to those formed by the conventional method.

Silicon melt 70 within melt vessel 40 is brought into direct contact with insulating layer 43 of melt vessel 40, but insulating layer 43 is thin and highly thermally conductive and cooled by means of the induction coil 41 and the block 42 actively cooled with water from behind, so that no contaminant is extracted and thus the high purity of the silicon melt 70 is maintained and consumption of the melt vessel 40 is prevented.

Electron beams are applied to the Si in the vessel during the first stage of melting in each of the two basic aspects of the invention (skull layer and no skull layer), where silicon as raw material is locally melted, prior to the electro-magnetic melting of silicon as raw material charged into the melt vessel 40. A method, in which an electro-magnetic field is formed within a vessel under the condition that a high-melting-point electric conductor such as graphite or molybdenum is brought into contact with silicon within the vessel to heat first the high-melting-point electric conductor, thereby forming a pool in surrounding silicon, has been disclosed in Japanese Patent Application Laid-Open No. Hei 1-264920 and Japanese Patent Application Laid-Open No. Hei 2-30698 as the conventional melting method of the first stage. In such methods of first stage melting, contamination with impurities from the high-melting-point electric conductor is inevitable, but because electron beams are used in the first stage of melting in the present invention, contamination of the melt with impurities can be prevented and thus single crystalline rods 62 and 72 can be still more improved in quality.

Having now generally described this invention, a further understanding can be obtained by reference to certain specific examples which are provided herein for purposes of illustration only and are not intended to be limiting unless otherwise specified.

A single-crystal silicon rod 50 mm in diameter was manufactured according to CZ method with the direct melt process using the apparatus shown in FIG. 1. The initial melting was conducted two different ways using graphite and an electron beam, respectively. The magnetic shield was not used. Table 1 shows the requirements for the magnetic melting and pulling operation. For the purpose of comparison, a single-crystal rod of the same size was manufactured according to FZ method and the conventional CZ method using an indirect melting process. The initial melt process in the latter method was conducted with graphite. The qualities of the respective single-crystal silicon rods are shown in Table 2. Power consumption and wear of melt reservoirs were compared between the direct and indirect melt processes.

As seen in Table 2, the direct melt process achieved power savings of about 40% of the indirect melt process. Also, the induction frequency, which is as low as 3 KHz, made the surface of the silicon melt stable and dispersion of the specific resistance uniform. Also, the initial melt process using the electron beam was adopted to cause no contamination of the single-crystal silicon with carbon, thereby providing the grown single-crystal silicon with quality equivalent to the conventional FZ method.

TABLE 1

| | | |
|---|---|---|
| Requirements for electro-magnetic melting | Power frequency | 3 kHz |
| | Inner diameter of melt reservoir (Induction coil) | 150 mm |
| | Insulating material | SiO$_2$ (silicon dioxide) |
| | Thickness of insulating material | 0.2 mm |
| | Power output | 30 kw |
| | Molten silicon | 5.5 kg |
| | Type of magnetic shield | Annular molybdenum member (not cooled) |
| | Diameter of magnetic shield | 142 mm |
| | Height of magnetic shield | 30 mm |
| Requirements for pulling operation | Pull velocity | 2.0 mm/min |
| | Shield rotation | 20 rpm |
| | Rotation of melt reservoir | None |
| | Diameter of single-crystal silicon rod | 50 mm |
| | Type of semiconductor | P type, ab.1Ω · cm |

TABLE 2

| Evaluated items | Indirect melting | Direct dissolution | | FZ method |
| --- | --- | --- | --- | --- |
| | | Graphite | Electron beam | |
| Power consumption | 75 kw | 30 kw | 30 kw | — |
| Wear of reservoir | None | None | None | — |
| Quality | | | | |
| Oxygen density | less than analysis limit | less than analysis limit | less than analysis limit | less than analysis limit |
| Carbon density | $2\text{-}7 \times 10^{16}$ atoms/cc | $2\text{-}7 \times 10^{16}$ atoms/cc | $10^{16}$ atoms/cc or less | $10^{16}$ atoms/cc or less |
| Lifetime | 100–150 μsec | 100–150 μsec | 250 μsec | 250 μsec |
| Dispersion of specific resistance | Nonuniform | Uniform | Uniform | Uniform |

In the melt reservoir 40 used in the above example, the induction coil 41 is closed at its bottom with the fireproofing bottom plate 42. The bottom plate may use an induction coil 45 as shown in FIG. 3.

Figure 3:
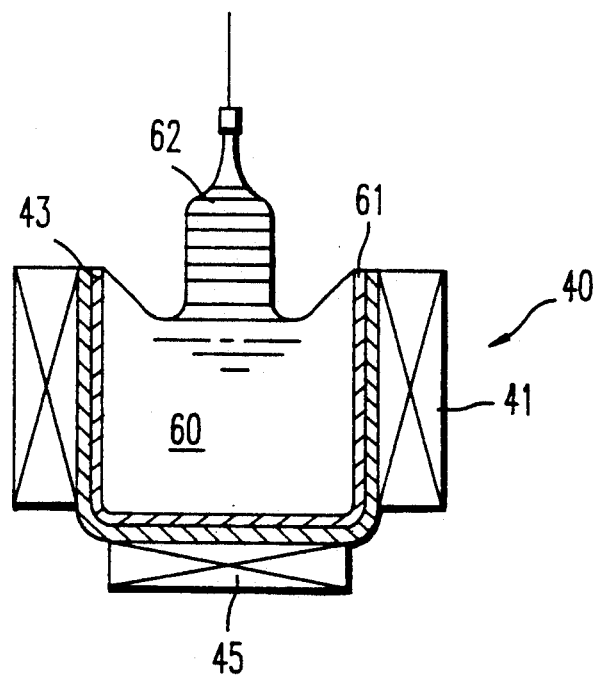
FIG. 3 is a schematic sectional view of a modified embodiment of the melt reservoir of FIG. 1.

In the melt reservoir 40 shown in FIG. 3, the induction coil 45 is in a configuration of a pancake as coiled in the same direction as the induction coil 41 constituting the side wall to facilitate heating of silicon placed in the reservoir 40. The induction coil 45 may be provided with an insulating layer 43 similar to induction coil 41.

In the apparatus shown in FIG. 4, a single crystalline rod having a diameter of 50 mm was produced by the direct CZ electro-magnetic melting process without the skull layer. The electro-magnetic melting conditions and the drawing-up conditions are shown in Table 3. For comparison, single crystalline silicon rods having the same size were produced by the direct CZ electro-magnetic melting process using the skull layer, the conventional CZ indirect electro-magnetic melting process and the FZ method. The qualities of the respectively produced single crystalline rods are shown in Table 4. Also the comparisons of the consumption of electric power and the consumed condition of the vessel were made between the direct melting process and the indirect melting process.

As shown in Table 4, savings by about 40% in the consumption of electric power were realized by the electro-magnetic melting techniques in comparison to the indirect electro-magnetic melting method. In addition, in spite of the low induction frequency to an extent of 6 kHz, the surface of the silicon melt was stabilized. In particular, a uniformity in the distribution of specific resistance was realized by applying the direct current magnetic field onto the silicon melt. Elimination of the skull layer led to easy temperature control of the silicon melt and the impurities were reduced in spite of the absence of the skull layer. And, in the case where the direct current magnetic field acted upon the silicon melt, also convection of the silicon melt could be remarkably suppressed and thus the crystal could be uniformly grown. As a result, the silicon single crystal which is grown is equivalent to that obtained by the FZ method in quality.

TABLE 3

| Electromagnetic melting conditions | |
| --- | --- |
| Frequency of power source | 6 kHz |
| Inside diameter of the melt vessel (induction coil) | 150 mm |
| Insulating material | Silicon oxide |
| Thickness of the insulating layer | 0.2 mm |
| Output of power source | 30 kw |
| Quantity of molten silicon | 5.5 kg |
| Drawing-up conditions | |
| Drawing-up speed | 2.0 mm/min |
| Rotation of seeds | 20 rpm |
| Rotation of the melt vessel | No |
| Diameter of single crystals | 50 mm |
| Type of Semiconductor | P-type ca.1Ω · cm |

TABLE 4

| Evaluation item | Consumption of electric power | Consumption of vessel | Conc. of oxygen | Quality | | Specific resist. distribution | Note |
| --- | --- | --- | --- | --- | --- | --- | --- |
| | | | | Conc. of carbon | Lifetime | | |
| Indirect melting | 75 kw | None | Less than analytical limit | $2 \text{ to } 7 \times 10^{16}$ (atoms/cc) | 100 to 150 (μsec) | Uneven | *1 |
| (3) (1) | 30 kw | None | Less than analytical limits | $1 \text{ to } 4 \times 10^{16}$ (atoms/cc) | 100 to 150 (μsec) | Uneven | *2 |
| (4) | 30 kw | None | Less than analytical limit | $1 \text{ to } 4 \times 10^{16}$ (atoms/cc) | 100 to 150 (μsec) | Uneven | *3 |
| Direct melting | | | | | | | |
| (3) (2) | 30 kw | None | $1 \text{ to } 2 \times 10^{17}$ (atoms/cc) | $2 \text{ to } 4 \times 10^{16}$ (atoms/cc) | 100 to 200 (μsec) | Slightly uneven | *4 |
| (4) | 30 kw | None | Less than analytical limit | $1 \text{ to } 4 \times 10^{16}$ (atoms/cc) | 150 to 250 (μsec) | Even | — |
| FZ method | — | — | Less than | $10^{16}$ or less | 250 | Even | — |

TABLE 4-continued

| Evaluation item | Consumption of electric power | Consumption of vessel | Conc. of oxygen | Quality | | Specific resist. distribution | Note |
|---|---|---|---|---|---|---|---|
| | | | analytical limit | Conc. of carbon (atoms/cc) | Lifetime (μsec) | | |

[Note]
*1 The surface of the silicon melt surges during the time when the silicon melt is drawn up and thus the specific resistance distribution becomes uneven.
*2 It is difficult to make the diameters of crystals constant during the time when the silicon melt is drawn up.
*3 It is difficult to control the temperature of the silicon melt during the time when the silicon melt is drawn up.
*4 The surface of the silicon melt surges slightly during the time when the silicon melt is drawn up and thus the specific resistance distribution becomes slightly uneven.
(1) With the skull layer
(2) Without the skull layer
(3) Without the direct current magnetic field
(4) With the direct current magnetic field It is noted that block 42 at the base of melt vessel 40 may be formed of a pancake-like coil wound in the same direction as induction coil 41.

As can be ascertained from the evidence above, the aspects of the present invention for preparing a single-crystal silicon provide advantages of exhibiting a notably higher power consumption efficiency, a superior quality single-crystal silicon product and no wear of the melt reservoir in which molten silicon is prepared; these advantages in comparison standing in contrast to the conventional CZ method which uses the electromagnetic melt process. Thus, the present invention provides a single-crystal silicon of high quality at a low cost, which facilitates the development of various silicon based electronic devices such as a highly effective solar battery, and the like.

Having now fully described the invention, it will be apparent to one of ordinary skill in the art that many changes and modifications can be made thereto without departing from the spirit or scope of the invention as set forth herein.

What is claimed as new and desired to be secured by Letters Patents of the United States is:

1. A method of preparing single crystal silicon, comprising:
    constructing a silicon melt reservoir of an induction coil coated on its internal surface with a layer of a high melting point insulating material and placing silicon raw material in the reservoir;
    heating said silicon raw material by application of an external heating means and by current applied to the induction coil which electromagnetically heats the silicon thereby forming a pool of molten silicon in the reservoir;
    actively cooling said induction coil; and
    drawing up a single crystal silicon rod from the molten silicon in the melt reservoir.

2. The method of claim 1, wherein the insulating layer is formed of $SiO_2$ or $Si_3N_4$.

3. The method of claim 1, wherein the silicon raw material in the reservoir is externally heated by an electron beam.

4. The method of claim 1, wherein the single crystal of silicon is drawn up under an inert atmosphere.

5. The method of claim 1, wherein an acting Lorentz force generated by the magnetic field suppresses the flow of the silicon melt upon the silicon melt when said flow of the silicon melt is applied to the silicon melt within the melt vessel separately from the alternating magnetic field which heats the silicon.

6. The method of claim 1, wherein said silicon raw material charged into the induction coil is a massive or granular polycrystalline silicon.

7. The method of claim 1, wherein the melt reservoir is replenished with granular polycrystalline silicon as the silicon raw material.

* * * * *